US011635683B2

(12) United States Patent
Osaki

(10) Patent No.: US 11,635,683 B2
(45) Date of Patent: Apr. 25, 2023

(54) METHOD FOR MANUFACTURING DEVICE, AND COMPOSITION

(71) Applicant: TOYO GOSEI CO., LTD., Ichikawa (JP)

(72) Inventor: Takeshi Osaki, Ichikawa (JP)

(73) Assignee: TOYO GOSEI CO., LTD., Ichikawa (JP)

( * ) Notice: Subject to any disclaimer, the term of this patent is extended or adjusted under 35 U.S.C. 154(b) by 0 days.

(21) Appl. No.: 17/317,988

(22) Filed: May 12, 2021

(65) Prior Publication Data

US 2021/0263409 A1 Aug. 26, 2021

Related U.S. Application Data

(62) Division of application No. 15/754,857, filed as application No. PCT/JP2016/074665 on Aug. 24, 2016, now abandoned.

(30) Foreign Application Priority Data

Aug. 24, 2015 (JP) ................... 2015-165205

(51) Int. Cl.
  C08F 2/46 (2006.01)
  C08F 2/50 (2006.01)
  C08G 61/04 (2006.01)
  G03F 7/00 (2006.01)
  C08K 5/134 (2006.01)
  C08F 220/28 (2006.01)
  C08F 220/18 (2006.01)
  C08K 5/13 (2006.01)
  C08K 5/1575 (2006.01)
  C08K 5/3435 (2006.01)
  C08F 222/10 (2006.01)

(52) U.S. Cl.
  CPC ...... *G03F 7/0002* (2013.01); *C08F 220/1807* (2020.02); *C08F 220/281* (2020.02); *C08K 5/13* (2013.01); *C08K 5/134* (2013.01); *C08K 5/1345* (2013.01); *C08K 5/1575* (2013.01); *C08K 5/3435* (2013.01); *C08F 220/1811* (2020.02); *C08F 220/283* (2020.02); *C08F 222/102* (2020.02); *C08F 222/103* (2020.02)

(58) Field of Classification Search
  CPC ........ C08K 5/13; C08K 5/134; C08K 5/1345; C08K 5/3435; C08K 5/1575; C08F 220/1807; C08F 220/281; C08F 220/283; C08F 220/1811; C08F 222/103; C08F 222/102; G03F 7/0002
  USPC ........... 522/57, 49, 6, 71, 189, 184, 1; 520/1
  See application file for complete search history.

(56) References Cited

U.S. PATENT DOCUMENTS

| | | |
|---|---|---|
| 2003/0035917 A1 | 2/2003 | Hyman |
| 2011/0070448 A1 | 3/2011 | Matsumura et al. |
| 2013/0032971 A1 | 2/2013 | Omatsu et al. |
| 2015/0228498 A1 | 8/2015 | Hattori et al. |
| 2016/0060472 A1 | 3/2016 | Takahashi et al. |
| 2016/0208127 A1 | 6/2016 | Wada et al. |
| 2016/0251527 A1 | 9/2016 | Okamoto et al. |
| 2017/0114239 A1 | 4/2017 | Fujiwara et al. |

FOREIGN PATENT DOCUMENTS

| | | | |
|---|---|---|---|
| JP | 2004-20702 A | | 1/2004 |
| JP | 2010-34513 A | | 2/2010 |
| JP | 2010-67935 A | | 3/2010 |
| JP | 2010-87165 A | | 4/2010 |
| JP | 2011-162716 A | | 8/2011 |
| JP | 2011-222732 A | | 11/2011 |
| JP | 2013-23630 A | | 2/2013 |
| JP | 2013023630 | * | 2/2013 |
| JP | 2014-93385 A | | 5/2014 |
| WO | WO 2012/133694 A1 | | 10/2012 |
| WO | WO 2013/132714 A1 | | 9/2013 |

OTHER PUBLICATIONS

Yurugi, JP 2013-023630 Machine Translation, Feb. 4, 2013 (Year: 2013).*
Daimatsu et al, JP 2011-222732 Machine Translation, Nov. 4, 2011 (Year: 2011).
Matsuda, JP 2011162716 Machine Translation, Aug. 25, 2011 (Year: 2011).
Matsumoto et al, Table 1 Machine Translation, Sep. 12, 2013 (Year: 2013).
Matsumoto et al, WO 2013-132714 Machine Translation, Sep. 12, 2013 (Year: 2013).

(Continued)

*Primary Examiner* — Jessica Whiteley

(74) *Attorney, Agent, or Firm* — Birch, Stewart, Kolasch & Birch, LLP

(57) ABSTRACT

A method for manufacturing a device including a substrate and a second film disposed above the substrate includes: forming a first film above the substrate using a composition containing a polymerizable monomer and an oxidation inhibitor; and forming the second film by curing the first film in a state where at least one part of a mold having a convexo-concave pattern is in contact with the first film, or after at least one part of the mold is brought into contact with the first film. The oxidation inhibitor is at least one of a hindered amine compound and a hindered phenol compound having a molecular weight of 700 or more. The composition satisfies a relationship of $(t_{o(T)} - t_{x(T)})/t_{o(T)} \times 100 \leq 13.0$. ($t_{o(T)}$ is a height of a convex part of cured film obtained by the specific method, and $t_{x(T)}$ is the corresponding height after heating at 260° C.)

6 Claims, 1 Drawing Sheet

(56) References Cited

OTHER PUBLICATIONS

Suzuki et al, WO 2012-133694 Machine Translation, Oct. 4, 2012 (Year: 2012).
Yonezawa et al, JP 2010067935 Machine Translation, Mar. 25, 2010 (Year: 2010).

* cited by examiner

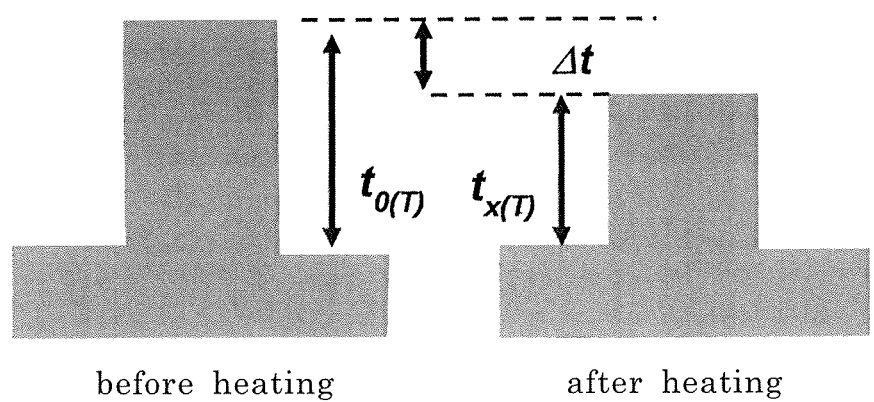
before heating     after heating

METHOD FOR MANUFACTURING DEVICE, AND COMPOSITION

CROSS-REFERENCE TO RELATED APPLICATIONS

This application is a Divisional of U.S. application Ser. No. 15/754,857, filed on Feb. 23, 2018, which is the National Phase under 35 U.S.C. § 371 of International Application No. PCT/JP2016/074665, filed on Aug. 24, 2016, which claims the benefit under 35 U.S.C. § 119(a) to Patent Application No. 2015-165205, filed in Japan on Aug. 24, 2015, all of which are hereby expressly incorporated by reference into the present application.

TECHNICAL FIELD

One aspect of the present invention relates to a method for manufacturing a device such as an optical or electronic component, and a composition preferably used for the manufacturing method.

BACKGROUND ART

A method for manufacturing a device such as an optical or electronic component uses a nanoimprint technique for pressing a mold having a convexo-concave pattern formed thereon into a composition, performing a mechanical change, and transferring a fine pattern precisely.

A nanoimprint process generally includes four elements of (1) application, (2) press, (3) transfer (light or heat), and (4) release, and nano-sized processing is possible in a simple process. In addition, an apparatus of the nanoimprint process is simple, and a high throughput is expected. Therefore, the nanoimprint technique is expected as a microfabrication technique capable of mass production at low cost. For these reasons, efforts to practical use in various fields such as a semiconductor device, a storage medium, biotechnology, and an optical member are progressing (see Patent Literature 1).

CITATION LIST

Patent Literature

Patent Literature 1: JP 2004-20702 A

SUMMARY OF INVENTION

Technical Problem

Deformation or a change in size of a cured product obtained by a nanoimprint method occurs disadvantageously due to heat and light generated in a process of manufacturing a device or heat and light generated in an operation of the device. Therefore, a composition having excellent heat resistance and/or light resistance, capable of reducing the deformation and the change in size is desired. However, a conventional composition has problems in terms of heat resistance and light resistance.

One object of some aspects of the present invention is to provide a method for manufacturing a device having excellent heat resistance and/or light resistance.

Solution to Problem

As a result of intensive studies to solve the above problems and the like, the present inventor has found that a device manufactured using a composition containing a specific component has excellent heat resistance and/or light resistance, and has completed some aspects of the present invention.

One aspect of the present invention provides a method for manufacturing a device including a substrate and a second film disposed above the substrate, including:

forming a first film above the substrate using a composition containing a polymerizable monomer and an oxidation inhibitor; and forming the second film by curing the first film in a state where at least one part of a mold having a convexo-concave pattern is in contact with the first film, or after at least one part of the mold is brought into contact with the first film, in which the oxidation inhibitor is at least one of a hindered amine compound and a hindered phenol compound having a molecular weight of 700 or more, and the composition satisfies a relationship of $(t_{0(T)} - t_{x(T)})/t_{0(T)} \times 100 \le 13.0$, where $t_{0(T)}$ is a height of a convex part of a convexo-concave part of a cured film having the convexo-concave part obtained by forming a coating film using the composition and then by curing the coating film in a state where the coating film is in contact with a convexo-concave part in which a depth of a concave part is 3 μm and a line width thereof is 5 μm, included in the mold, and $t_{x(T)}$ is a height of the convex part after the cured film is heated from 25° C. to 260° C. over five minutes, then the temperature of the cured film is held at 260° C. for five minutes, and then the cured film is cooled to 25° C. over 30 minutes.

One aspect of the present invention provides a method for manufacturing a device including a substrate and a second film disposed above the substrate, including:

forming a first film above the substrate using a composition containing a polymerizable monomer and an oxidation inhibitor; and forming the second film by curing the first film in a state where at least one part of a mold having a convexo-concave pattern is in contact with the first film, or after at least one part of the mold is brought into contact with the first film, in which the oxidation inhibitor is a hindered amine compound and the blending amount of the hindered amine compound is 0.5% by mass or more in the composition, and the composition satisfies a relationship of $(t_{0(L)} - t_{x(L)})/t_{0(L)} \times 100 \le 10.0$, where $t_{0(L)}$ is a height of a convex part of a convexo-concave part of a cured film having the convexo-concave part obtained by forming a coating film using the composition and then by curing the coating film in a state where the coating film is in contact with a convexo-concave part in which a depth of a concave part is 3 μm and a line width thereof is 5 μm, included in the mold, and $t_{x(L)}$ is a height of the convex part after the cured film is irradiated with light at 60° C. for 60 days under a condition of 765 W/cm² with a xenon lamp.

Advantageous Effects of Invention

One aspect of the present invention can provide a method for manufacturing a device having excellent heat resistance and/or light resistance.

BRIEF DESCRIPTION OF DRAWINGS

FIG. 1 is a view for describing a reduction ratio of change in height of a convex part of a cured film having a pattern.

DESCRIPTION OF EMBODIMENTS

Hereinafter, some aspects of the present invention will be described in detail.

A method for manufacturing a device according to one aspect of the present invention is a method for manufacturing a device including a substrate and a second film disposed above the substrate, including:

forming a first film above the substrate using a specific composition; and forming the second film by curing the first film in a state where at least one part of a mold having a convexo-concave pattern is in contact with the first film, or after at least one part of the mold is brought into contact with the first film.

<Composition 1>

A composition (hereinafter, also referred to as "composition 1") used in a method for manufacturing a device according to one aspect of the present invention will be described below.

The composition 1 is characterized in that the composition 1 contains a polymerizable monomer and an oxidation inhibitor, the oxidation inhibitor is at least one of a hindered amine compound and a hindered phenol compound having a molecular weight of 700 or more, and the composition 1 satisfies the relationship of the above formula $(t_{0(T)}-t_{x(T)})/t_{0(T)} \times 100 \leq 13.0$.

Satisfaction of the relationship of $(t_{0(T)}-t_{x(T)})/t_{0(T)} \times 100 \leq 13.0$ means that a cured film sample having a convexo-concave part obtained under the following condition using the composition 1 has a reduction ratio of 13.0% or less in a height of the convex part before and after heating.

(1) A coating film is formed using the composition 1. Thereafter, the coating film of the composition 1 is cured in a state where the coating film is in contact with a convexo-concave part in which the depth of a concave part is 3 µm and a line width thereof is 5 µm, included in a mold, to manufacture a cured film sample having a convexo-concave part.

(2) The cured film sample is heated from 25° C. to 260° C. over five minutes, the temperature of the cured film sample is further held at 260° C. for five minutes, and then the cured film sample is cooled to 25° C. over 30 minutes to obtain a cured film sample after heating.

(3) A reduction ratio in height of the convex part of the cured film samples before heated and after heated is measured.

(Oxidation Inhibitor)

A hindered amine compound as the oxidation inhibitor preferably has a polymerizable group in a molecule thereof. This makes the hindered amine compound incorporated into a resin component when the composition is cured. Therefore, heat resistance and/or light resistance of the cured product of the composition are improved. The polymerizable group is not particularly limited as long as being polymerizable with the polymerizable monomer, but preferable examples thereof include a radically polymerizable group such as a (meth)acryloyloxy group, a vinyl group, an allyl group, or a styryl group.

Note that, in the present invention, "(meth)acryloyl" means inclusion of both acryloyl and methacryloyl.

The hindered amine compound preferably has at least one structure represented by the following formula (1) in the molecule thereof.

[Chemical formula 1]

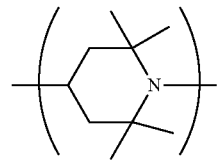

(1)

When the hindered amine compound has one structure represented by the above formula (1) in the molecule thereof, examples thereof include a compound having a structure represented by the following formula (2).

[Chemical formula 2]

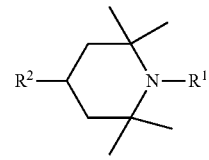

(2)

In the above formula (2), $R^1$ is preferably any one selected from the group consisting of a hydrogen atom, an alkyl group which may have a substituent, and an alkoxy group which may have a substituent.

Examples of the alkyl group of $R^1$ include a linear or branched alkyl group having 1 to 5 carbon atoms, such as a methyl group, an ethyl group, an isopropyl group, an n-isopropyl group, a sec-butyl group, a tert-butyl group, an n-butyl group, or a pentyl group.

Examples of the alkoxy group of $R^1$ include an alkoxy group having 1 to 15 carbon atoms, such as a methoxy group, an ethoxy group, or a propoxy group.

Examples of the substituent which $R^1$ may have include a hydroxy group, a sulfonyloxy group, an alkylcarbonyloxy group, a cyano group, and an alkoxy group.

A total number of carbon atoms in $R^1$ is preferably 1 to 20, and more preferably 1 to 11 including carbon atoms of a substituent from a viewpoint of solubility with another component.

In the above formula (2), $R^2$ is a monovalent organic group, and examples of the monovalent organic group of $R^2$ include an alkyl group, a hydroxy group, a carboxy group, an alkylcarbonyloxy group, an amino group, and a group containing the above polymerizable group, but are not limited thereto. Furthermore, the alkyl group, the alkylcarbonyloxy group, the amino group, and the group containing the above polymerizable group as $R^2$ may have a substituent.

Examples of the alkyl group of $R^2$ include a linear or branched alkyl group having 1 to 5 carbon atoms, such as a methyl group, an ethyl group, an isopropyl group, an n-isopropyl group, a sec-butyl group, a tert-butyl group, an n-butyl group, or a pentyl group. Examples of the substituent which the alkyl group may have include a hydroxy group, a sulfonyloxy group, an alkylcarbonyloxy group, an alkyloxycarbonyl group, a cyano group, and an alkoxy group.

The group containing the above polymerizable group is not particularly limited as long as containing the above polymerizable group, and may be, for example, the polymerizable group itself or a group in which the above polymerizable group is bonded to the alkyl group, the amino group, or the like.

Examples of the substituent which the alkylcarbonyloxy group may have include a hydroxy group, a sulfonyloxy group, an alkylcarbonyloxy group, an alkyloxycarbonyl group, a cyano group, and an alkoxy group.

Examples of the substituent which the amino group may have include the alkyl group having 1 to 5 carbon atoms.

Examples of the substituent which the group containing the polymerizable group may have include a halogen atom, an alkyl group, a hydroxy group, a sulfonyloxy group, an alkylcarbonyloxy group, an alkyloxycarbonyl group, a cyano group, and an alkoxy group.

When the hindered amine compound has two structures represented by the above formula (1), the hindered amine compound preferably has a structure represented by the following formula (3).

Furthermore, the hindered amine compound may be a high molecular weight type compound containing a unit represented by the following formula (4) or (5). In a case of the high molecular weight type compound, the hindered amine compound preferably has a weight-average molecular weight of 5000 or less in terms of polystyrene from a viewpoint of solubility.

[Chemical formula 3]

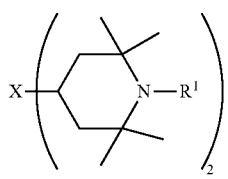
(3)

[Chemical formula 4]

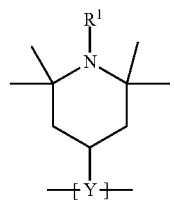
(4)

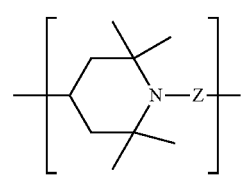
(5)

In the above formulas (3) to (5), there is no particular limitation as long as X and Z are each independently a divalent organic group and Y is a trivalent organic group.

Examples of X include an alkylene group, an alkylene group bonded to a structure represented by the above formula (1) through an ester bond, an alkylene group containing an aromatic hydrocarbon group or a heteroaromatic group, an alkylene group having an ether bond, an alkylene group having an acetal bond, and —O—C(=O)—O—.

Examples of Y include a nitrogen atom having a substituent, a pyrrolidione structure bonded to an alkylene group, and a trivalent group bonded to a structure represented by the above formula (1) through an ester bond. Examples of the substituent of the nitrogen atom include an alkylene group and a divalent group containing an aromatic hydrocarbon group or a heteroaromatic group.

Examples of Z include an alkylene group, an alkylene group having an ester bond, an alkylene group containing an aromatic hydrocarbon group or a heteroaromatic group, an alkylene group having an ether bond, and an alkylene group having an acetal bond.

Examples of $R^1$ in the above formulas (3) to (5) include those similar to $R^1$ in the above formula (2).

As the hindered amine compound, TINUVIN 292, TINUVIN PA144, TINUVIN 765, TINUVIN 770DF, TINUVIN 622SF, Uninul 4050FF, Uninul 5050H, CHIMASORB 2020FDL, CHIMASORB 944 FDL, and the like manufactured by BASF SE; LA-52, LA-57, LA-63P, LA-68, LA-72, LA-77Y, G, LA-81, LA-82, and LA-87 manufactured by ADEKA CORPORATION; and the like are easily available and can be preferably used. These compounds can be used singly or in combination thereof. Preferable examples thereof include those illustrated below, but are not limited thereto.

[Chemical formula 5]

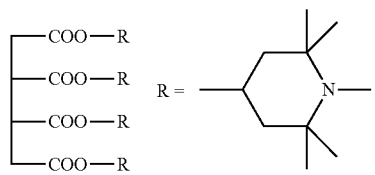

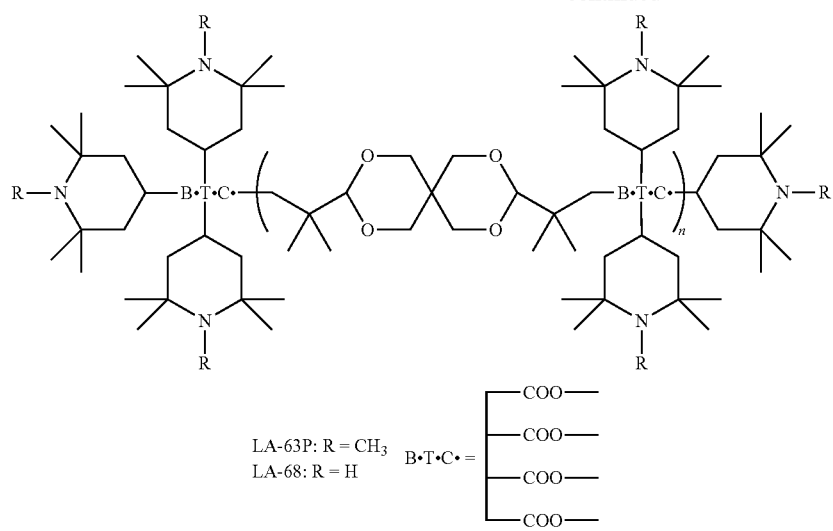
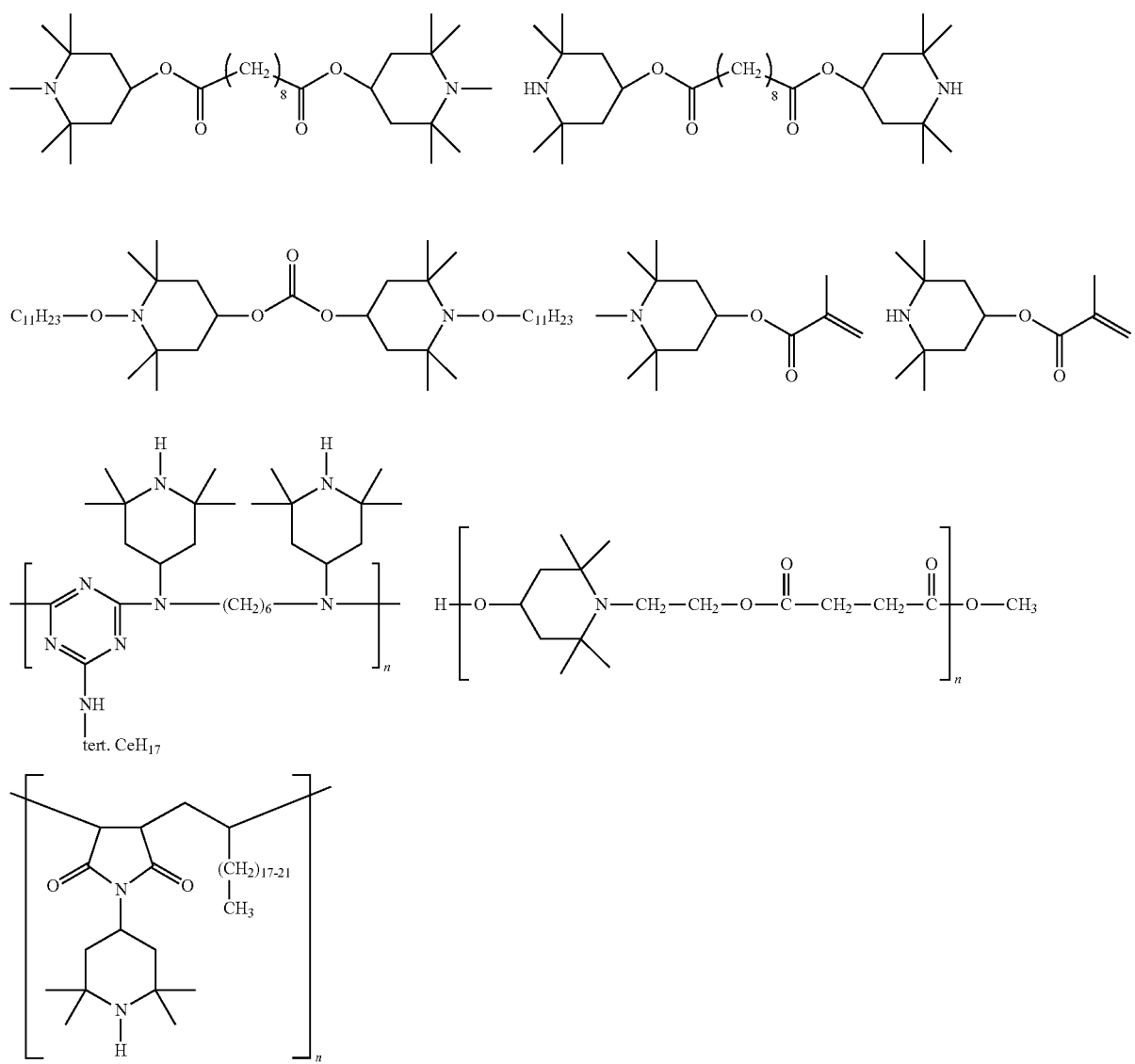

-continued

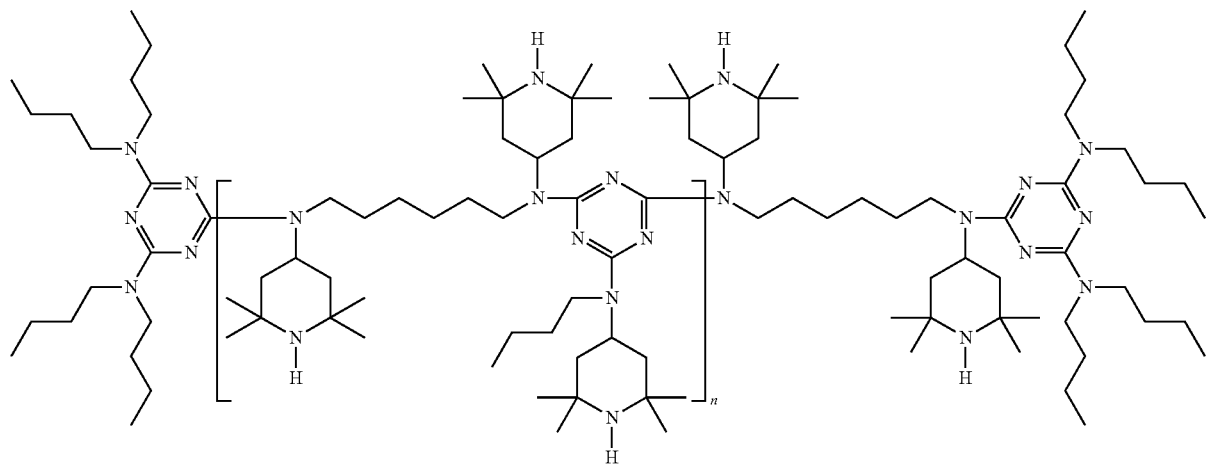

The hindered phenol compound preferably has at least one structure represented by the following formula (6) in the molecule thereof.

[Chemical formula 6]

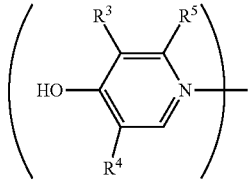

(6)

In the above formula (6), preferably, $R^3$ and $R^4$ are each independently any one selected from the group consisting of a hydrogen atom and an alkyl group, and $R^5$ is any one selected from the group consisting of a hydrogen atom and an alkyl group. The alkyl group serving as each of $R^3$ to $R^5$ may have a substituent.

Examples of the alkyl group include a linear or branched alkyl group having 1 to 5 carbon atoms, such as a methyl group, an ethyl group, an isopropyl group, an n-isopropyl group, a sec-butyl group, a tert-butyl group, an n-butyl group, or a pentyl group.

Examples of the substituent which the alkyl group may have include a hydroxy group, a sulfonyloxy group, an alkylcarbonyloxy group, an alkyloxycarbonyl group, a cyano group, a methoxy group, and an ethoxy group.

Preferably, $R^3$ to $R^5$ are each independently a hydrogen atom, a methyl group, or a tert-butyl group. At least one of ortho positions of a phenolic hydroxy group, that is, at least one of $R^3$ and $R^4$ is preferably a methyl group or a tert-butyl group, at least one of $R^3$ and $R^4$ is more preferably a tert-butyl group, and both of $R^3$ and $R^4$ are still more preferably tert-butyl groups.

When the hindered phenol compound has one structure represented by the above formula (6) in the molecule thereof, examples thereof include a compound having a structure represented by the following formula (7).

[Chemical formula 7]

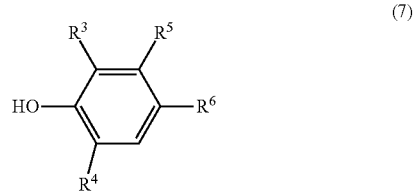

(7)

In the above formula (7), $R^6$ is a monovalent organic group, and examples of the monovalent organic group of $R^6$ include an alkyl group, a hydroxy group, a carboxy group, an alkylcarbonyloxy group, and an amino group, but are not limited thereto. Furthermore, each of the alkyl group, the alkylcarbonyloxy group, the amino group, and the like as $R^6$ may have a substituent. $R^3$ to $R^5$ in the above formula (7) are the same as those in the above formula (6).

Examples of the alkyl group as $R^6$ in the above formula (7) include a linear or branched alkyl group having 1 to 5 carbon atoms, such as a methyl group, an ethyl group, an isopropyl group, an n-isopropyl group, a sec-butyl group, a tert-butyl group, an n-butyl group, or a pentyl group.

Examples of the substituent which the alkyl group may have include a hydroxy group, a sulfonyloxy group, an alkylcarbonyloxy group, an alkyloxycarbonyl group, a cyano group, a methoxy group, and an ethoxy group.

Examples of the substituent which the alkylcarbonyloxy group may have include a hydroxy group, a sulfonyloxy group, an alkylcarbonyloxy group, an alkyloxycarbonyl group, a cyano group, a methoxy group, and an ethoxy group.

Examples of the substituent which the amino group may have include the alkyl group having 1 to 5 carbon atoms.

When the hindered phenol compound has two or more structures represented by the above formula (6), the hindered phenol compound preferably has a structure represented by the following formula (8).

[Chemical formula 8]

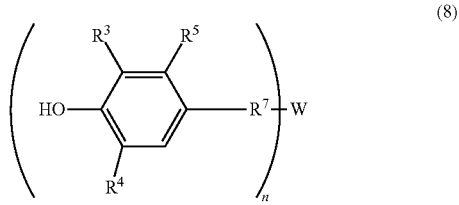

R³ to R⁵ in the above formula (8) are the same as those in the above formula (6). In the above formula (8), $R^7$ is not particularly limited as long as being a divalent organic group, but examples thereof include an alkylene group and an alkylene carbonyloxyalkylene group. n is 4 when W is a carbon atom. n is 3 when W is a trivalent organic group. n is 2 when W is any one selected from a divalent organic group, a sulfur atom, and an oxygen atom. Examples of the divalent organic group for W include groups similar to those of X in the above formula (3). Examples of the trivalent organic group include a benzene ring and triazinetrione.

The hindered phenol compound has a molecular weight of 700 or more, preferably 1000 or more. Furthermore, the molecular weight is more preferably 10000 or less. A molecular weight within the above range makes compatibility in the composition good, and improves heat resistance and/or light resistance of a cured product of the composition.

As the hindered phenol compound, Irganox 1010 (molecular weight 1178), Irganox 1330 (molecular weight 775), and Irganox 3114 (molecular weight 784) manufactured by BASF SE; AO-20 (molecular weight 784), AO-60 (molecular weight 1178), 60G (molecular weight 1178), AO-80 (molecular weight 741), and AO-330 (molecular weight 775) manufactured by ADEKA CORPORATION; and the like are easily available and can be preferably used. These compounds can be used singly or in combination thereof. Preferable examples thereof include those illustrated below, but are not limited thereto.

[Chemical formula 9]

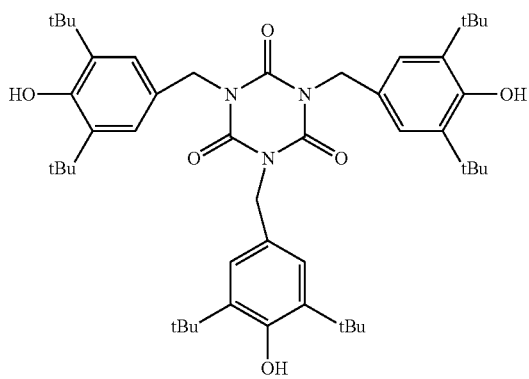

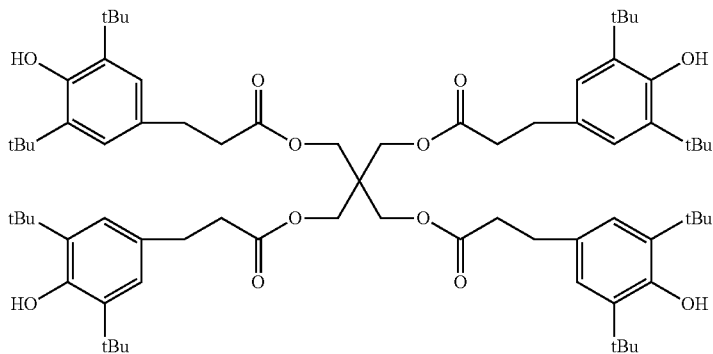

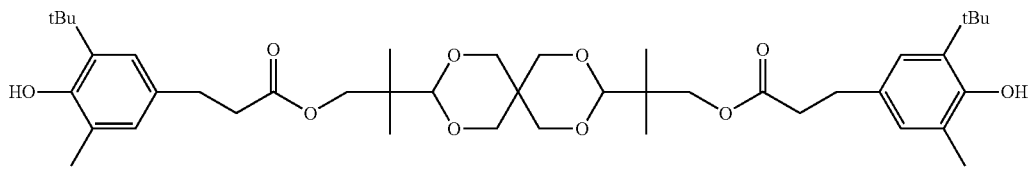

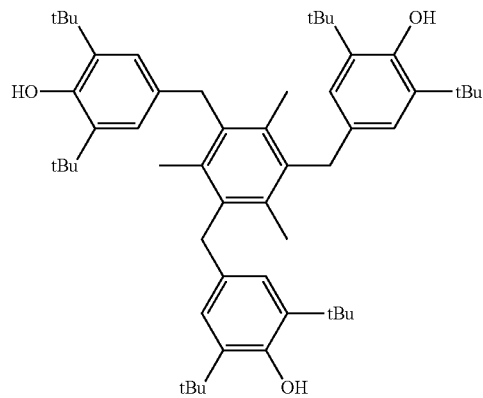

The content of the oxidation inhibitor is preferably 0.05 to 10% by mass in the composition excluding a solvent. The content is more preferably 0.1% by mass or more, still more preferably 0.2% by mass or more, particularly preferably 0.5% by mass or more, and more particularly preferably 1% by mass or more. The content of the oxidation inhibitor is more preferably 9% by mass or less, and still more preferably 5% by mass or less. The content of the oxidation inhibitor of 10% by mass or less is preferable because a possibility of a decrease in curability of the composition lowered or a disadvantage such as bleed-out from the cured product hardly occurs. Inclusion of the oxidation inhibitor within the above range can suppress film thickness shrinkage and a convexo-concave pattern size shrinkage due to heat generated in a process for manufacturing a device, and can suppress a decrease in transmittance. Furthermore, photopolymerization or thermal polymerization progresses efficiently, and curability can be sufficiently obtained.

More preferable contents are as follows depending on whether the hindered amine compound or the hindered phenol compound is used.

When the oxidation inhibitor is a hindered amine compound having no polymerizable group, the content thereof is more preferably 1 to 9% by mass in the composition excluding a solvent.

When the oxidation inhibitor is a hindered amine compound having a polymerizable group, the content thereof is preferably 0.2 to 9% by mass in the composition excluding a solvent.

When the oxidation inhibitor is a hindered phenol compound, the content thereof is more preferably 0.1 to 10% by mass, and still more preferably 0.5 to 9% by mass in the composition excluding a solvent.

The oxidation inhibitor is preferably a combination of the hindered amine compound and the hindered phenol compound. When the hindered amine compound and the hindered phenol compound are used in combination, the content of the hindered phenol compound is preferably 1 to 100 parts by mass, and more preferably 1 to 30 parts by mass relative to 10 parts by mass of the hindered amine compound. The hindered amine compound more preferably has a polymerizable group in the molecule thereof. A combination of the hindered amine compound with the hindered phenol compound having a molecular weight of 1000 or more is preferable because of suppressing volatility during polymerization.

(Polymerizable Monomer)

Examples of the polymerizable monomer according to one aspect of the present invention include a usual polymerizable monomer used for nanoimprint, microsize imprint, and millisize imprint without any particular limitation. Examples thereof include a compound having at least one radically polymerizable group in one molecule thereof, a compound having an oxirane ring, a vinyl ether compound, and a fluorine atom-containing polymerizable compound.

Preferable examples of the radically polymerizable group include a (meth)acryloyloxy group, a vinyl group, an allyl group, and a styryl group.

As the polymerizable monomer, a polymerizable monomer hardly decomposed by heat, for example, a polymerizable monomer having no heterocyclic structure is preferable from a viewpoint of heat resistance. For the same reason, as the radically polymerizable group, an acryloyloxy group, a vinyl group, and the like are more preferable.

As the above polymerizable monomer, an appropriate combination of a polymerizable monomer having one polymerizable group in one molecule thereof, a polymerizable monomer having two polymerizable groups in one molecule thereof, a polymerizable monomer having three or more polymerizable groups in one molecule thereof, and the like is preferably used. The polymerizable monomer preferably has a cyclic moiety such as an alicyclic group.

Content of the monofunctional monomer having one polymerizable group in one molecule thereof among the above polymerizable monomers is preferably 0.05 to 80% by mass, and more preferably 1 to 90% by mass in the composition excluding a solvent. Content of the bifunctional monomer having two polymerizable groups in one molecule thereof among the above polymerizable monomers is preferably 0 to 99.5% by mass, more preferably 1 to 90% by mass, and still more preferably 10 to 80% by mass in the composition excluding a solvent.

Content of the polyfunctional monomer having three or more polymerizable groups in one molecule thereof among the above polymerizable monomers is preferably 0 to 99.5% by mass, more preferably 1 to 90% by mass, and still more preferably 10 to 80% by mass in the composition excluding a solvent.

As the polymerizable monomer, a compound having a (meth)acryloyloxy group, an N-vinyl compound, an acrylamide compound, and the like are preferable. These monofunctional and polyfunctional compounds can be used singly or in appropriate combination thereof.

Examples of preferable polymerizable monomers in some aspects of the present invention are described below, but are not limited thereto.

[Chemical formula 10]
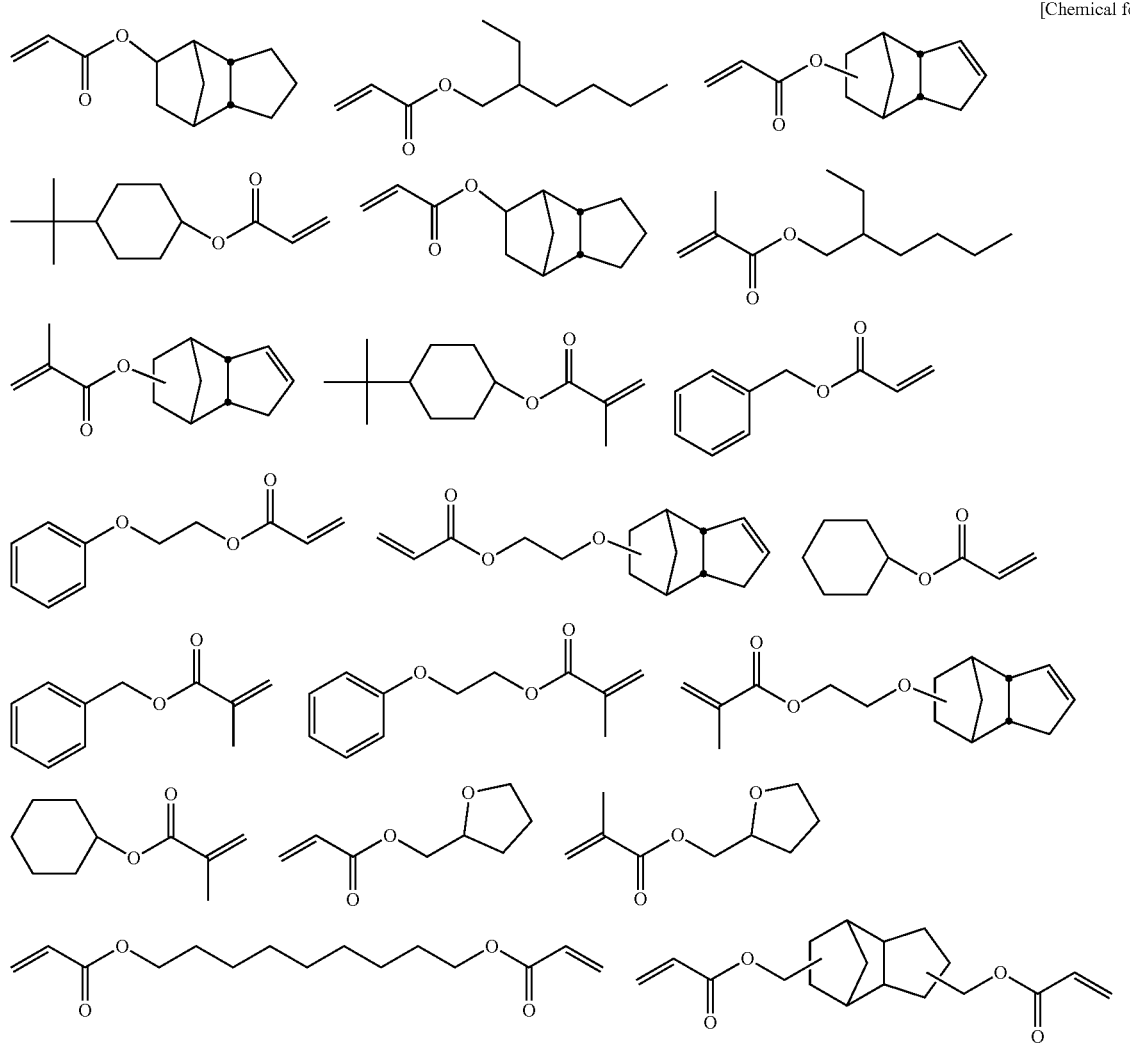
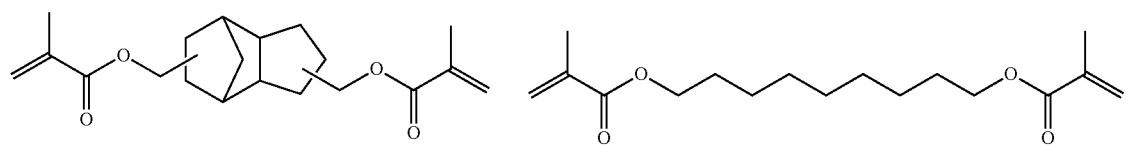
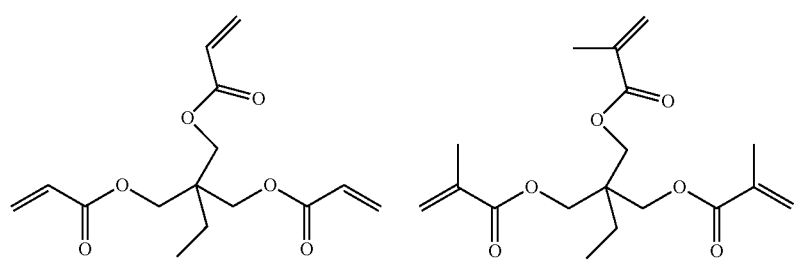

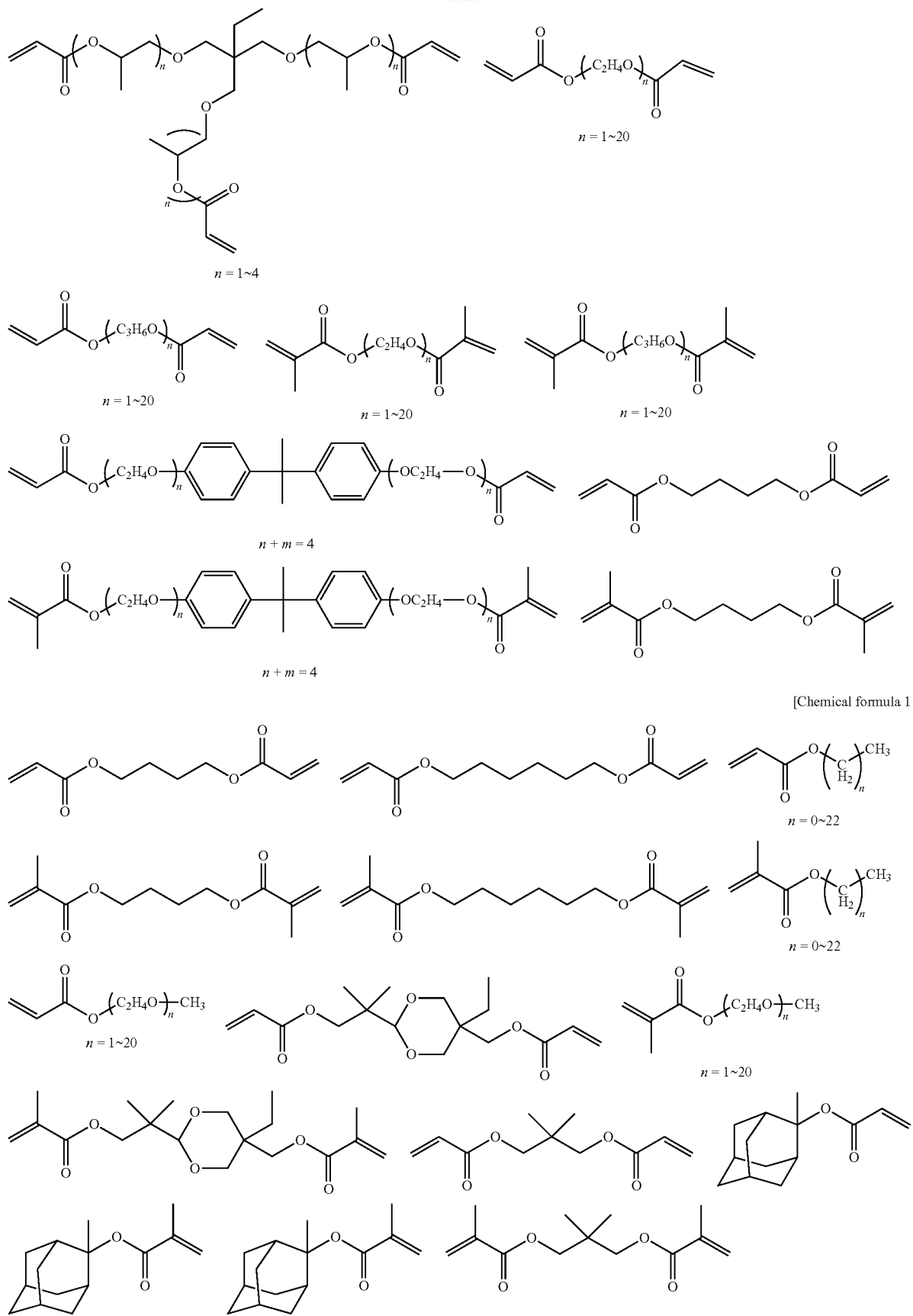

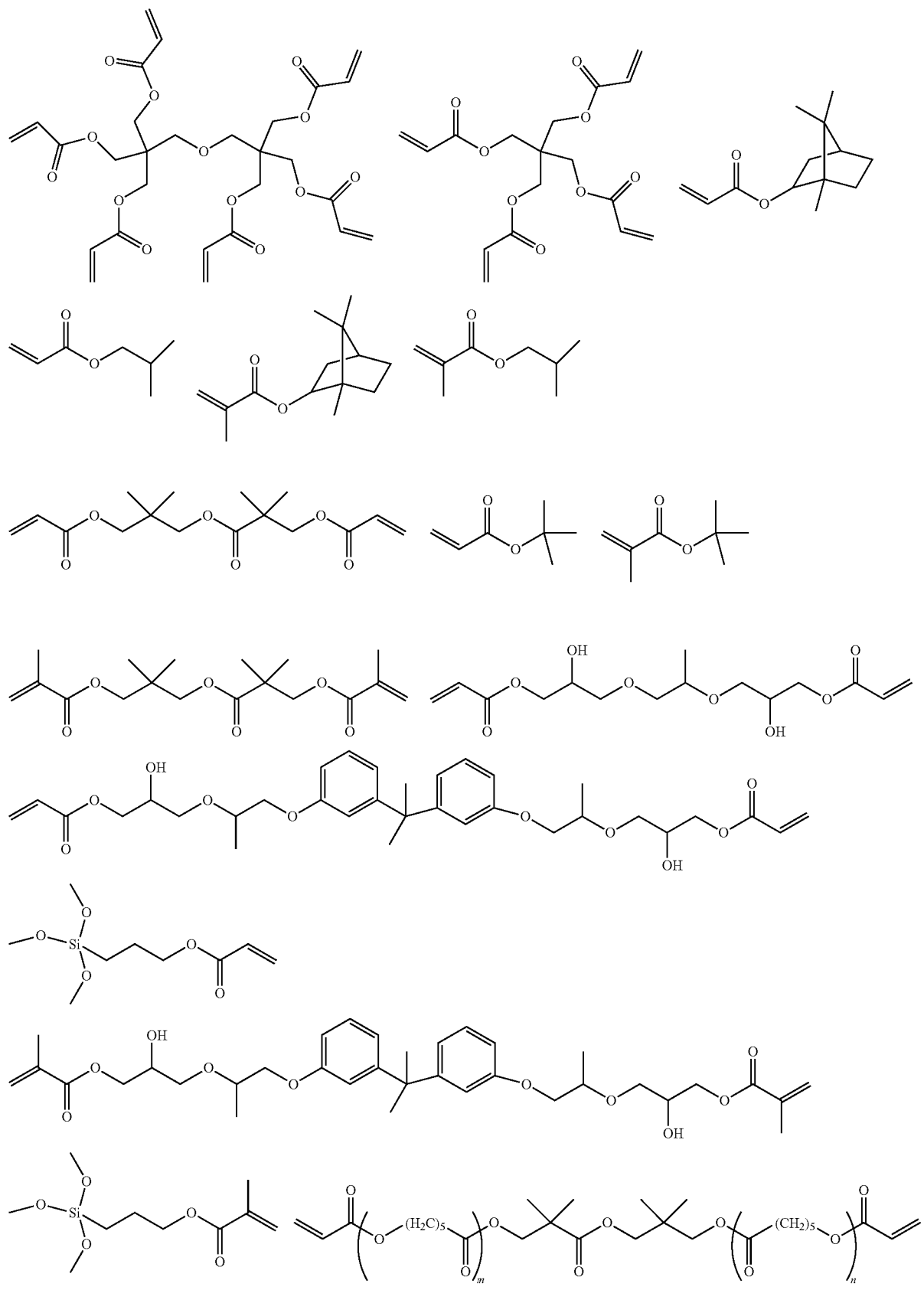

-continued
[Chemical formula 12]
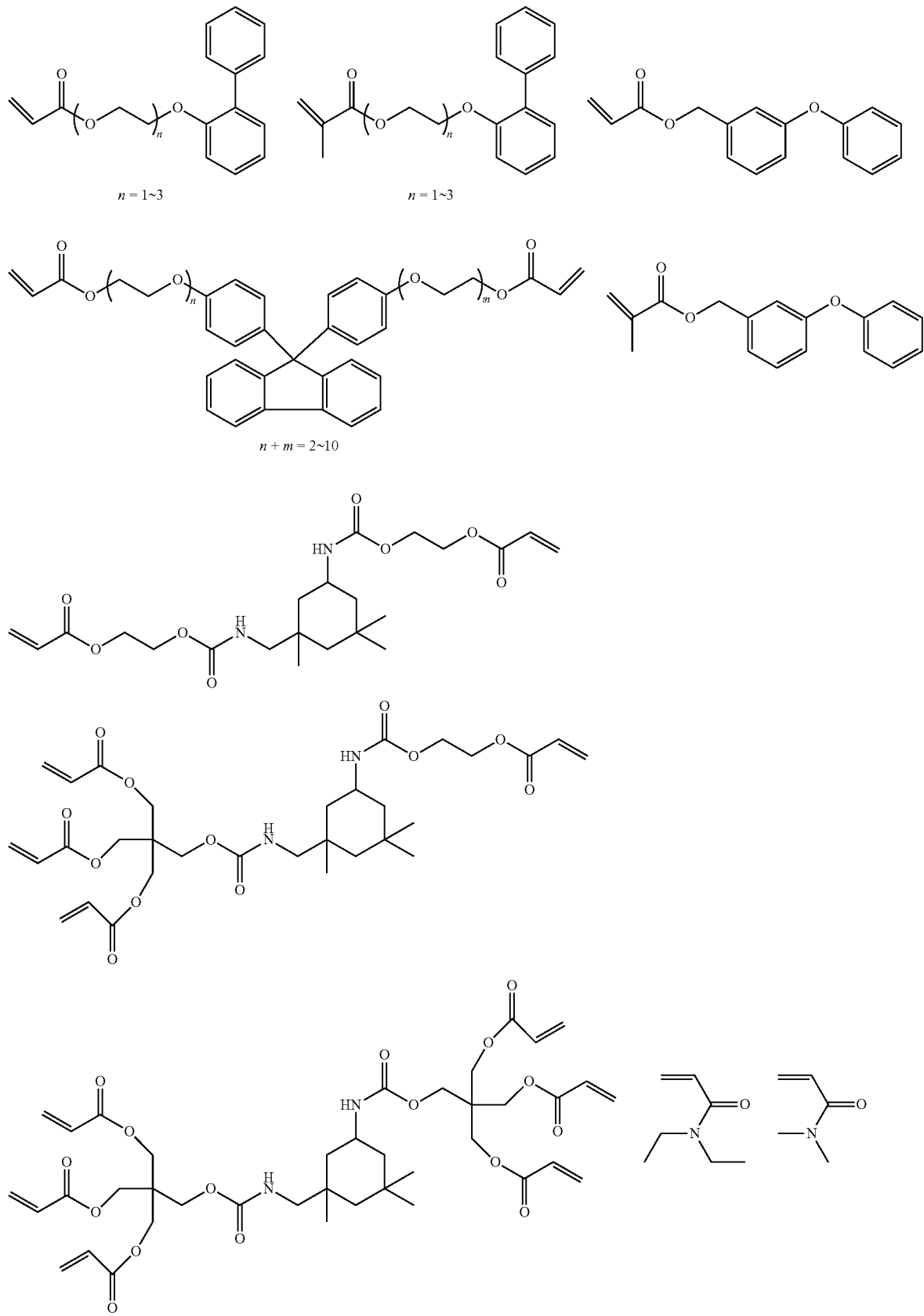

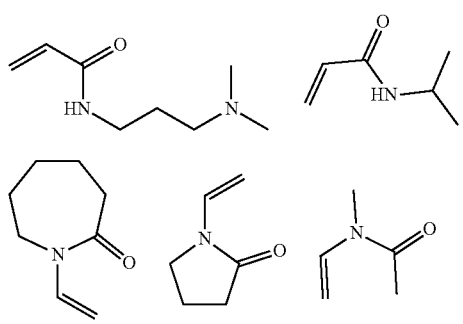
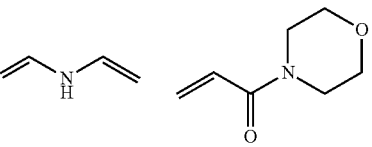

(Polymerization Initiator)

The composition according to one aspect of the present invention preferably further contains a polymerization initiator.

Examples of the polymerization initiator include a photopolymerization initiator. Preferable examples of the photopolymerization initiator include a radical polymerization initiator which generates radicals by irradiation with light and a cationic polymerization initiator which generates an acid by irradiation with light, and the radical polymerizable initiator is preferable. As these photopolymerization initiators, a usual photopolymerization initiator used in a composition for nanoimprint, microsize imprint, millisize imprint, or the like can be used.

Content of the photopolymerization initiator is preferably 0.01 to 20% by mass, and more preferably 0.5 to 15% by mass in the composition excluding a solvent.

Note that, in the present invention, "light" includes not only light having a wavelength in an ultraviolet region, a near ultraviolet region, a far ultraviolet region, a visible region, an infrared region, or the like, and an electromagnetic wave, but also a radiation.

A thermal polymerization initiator can be also used in place of or in combination with the photopolymerization initiator. The thermal polymerization initiator is only required to be an initiator usually used as a thermal polymerization initiator, and examples thereof include an azo compound and a peroxide.

(Other Component)

The composition according to one aspect of the present invention may contain another additive such as a silane coupling agent, a surfactant, a release agent, an adhesion promoter, a solvent, a polymer component, a filler, a polymerization inhibitor, a colorant, a plasticizer, a photo acid generator, a photobase generator, and the like within a range not impairing an effect of the present invention.

(Physical Property)

The composition 1 according to one aspect of the present invention is characterized in that a reduction ratio in height of the convex part of a cured film sample having the convexo-concave part obtained under the above condition before and after heating is 13.0% or less.

A mold used for obtaining the cured film sample is a quartz mold (product name: NIM-PH3000, manufactured by NTT Advanced Technology Co., Ltd.). Curing is performed in a nitrogen atmosphere by exposure with a Hg—Xe lamp at 20 mW/cm$^2$ (wavelength 365 nm) for 50 seconds.

Thereafter, the obtained cured film sample is released from the quartz mold, and the pattern height of the cured film sample is measured with a confocal laser microscope (OLS 3100, manufactured by Olympus Corporation). The pattern height measurement is performed at a position of a line and a space where the height of a convex part is 3 μm and the line width thereof is 5 μm.

The heights of the convex parts of the cured film sample before and after the heat treatment by the above method are measured, and the reduction ratio in heights is calculated based on the following formula.

$$\text{Reduction ratio} = (t_{0(T)} - t_{x(T)})/t_{0(T)} \times 100 \quad (A)$$

In the above formula (A), $t_{0(T)}$ and $t_{x(T)}$ are used as the height before heating and the height after heating, respectively, as illustrated in FIG. 1. The composition 1 satisfies the relationship of the following formula $(t_{0(T)} - t_{x(T)})/t_{0(T)} \times 100 \leq 13.0$.

In order for the composition 1 to satisfy the above physical property, the composition 1 only needs to contain the above components appropriately. Possession of the above physical property by the composition 1 makes it possible to obtain a cured film having a small change in shape of a convexo-concave pattern due to excellent heat resistance and having excellent transmittance.

<Composition 2>

A composition (hereinafter, also referred to as "composition 2") used in a method for manufacturing a device according to one aspect of the present invention will be described below.

The composition 2 is characterized in that the composition 2 contains a polymerizable monomer and an oxidation inhibitor, the oxidation inhibitor is the hindered amine compound, the blending amount of the hindered amine compound is 0.5% by mass or more in the composition, and the composition 2 satisfies a relationship of $(t_{0(L)} - t_{x(L)})/t_{0(L)} \times 100 \leq 10.0$.

Satisfaction of the relationship of $(t_{0(L)} - t_{x(L)})/t_{0(L)} \times 100 \leq 10.0$ means that a cured film sample having a convexo-concave part obtained under the following condition using the above composition 2 has a reduction ratio of 10% or less in height of the convex part before and after irradiation with light.

The above hindered phenol compound may be also used as the oxidation inhibitor in a similar manner to the above composition 1. The other components are similar to those of the composition 1.

(1) A coating film is formed using the composition. Thereafter, the composition is cured in a state where the coating film is in contact with a convexo-concave part in which a depth of a concave part is 3 μm and a line width thereof is 5 μm, included in a mold, to manufacture a cured film sample having a convexo-concave part.

(2) The cured film sample is irradiated with light at 60° C. for 60 days under a condition of 765 W/cm$^2$ with a xenon lamp to obtain a cured film sample after irradiation with light.

(3) A reduction ratio in height of the convex part of the cured film samples before and after irradiated with light is measured.

The mold used for obtaining the sample, the curing condition, and the method for measuring a reduction ratio in height of the convex part are similar to those of the composition 1.

In order for the composition 2 to satisfy the above physical property, the composition 2 only needs to contain the above components appropriately.

<Method for Manufacturing Device>

A method for manufacturing a device according to one aspect of the present invention includes:

forming a first film above a substrate using the above composition; and forming a second film by curing the first film in a state where at least one part of a mold having a convexo-concave pattern is in contact with the first film, or after at least one part of the mold is brought into contact with the first film, and a device including the substrate and the second film as a cured layer disposed above the substrate is thereby obtained.

Use of the above composition makes it possible to obtain a device with a cured layer having excellent heat resistance and/or light resistance, and therefore reduction in pattern height is suppressed.

The process used for the method for manufacturing a device can be a similar process to a usual process.

Note that, in some aspects of the present invention, a device pattern refers to pattern transfer of several nm to several mm size, and can be applied to pattern transfer of nano order, micro order, milli order, or the like. The methods for manufacturing a device according to some aspects of the present invention are particularly effective for fine pattern transfer of nano order and micro order.

A preferable size of a pattern which exhibits an optical function on an optical device has a relationship to a wavelength (($\lambda$) nm) of light which passes through the optical device or reflects on the optical device. In the present invention, a repetition period of the pattern is preferably $0.1\lambda$ nm to $100\lambda$ nm, the line width is preferably $0.05\lambda$ nm to $100\lambda$ nm, and the height is preferably $0.01\lambda$ nm to $200\lambda$ nm. A range of $\lambda$ is preferably a range of ultraviolet light to infrared light, and is preferably 100 nm to 10000 nm.

In addition, the above composition is preferably used in a method for manufacturing a device having a pattern size within the above range. This makes it possible to obtain a cured film having excellent heat resistance and light resistance, and to manufacture a device having a cured film with a small change in pattern shape and excellent transmittance.

EXAMPLES

Several aspects of the present invention will be described below based on Examples, but the present invention is not limited by these Examples at all.

<Preparation of Composition>

Composition samples 1 to 37 are prepared by blending components as indicated in Tables 1 and 2. Components A to N described in Tables 1 to 4 are specifically indicated below. In Tables, the blending ratio is based on mass.

[Chemical formula 13]

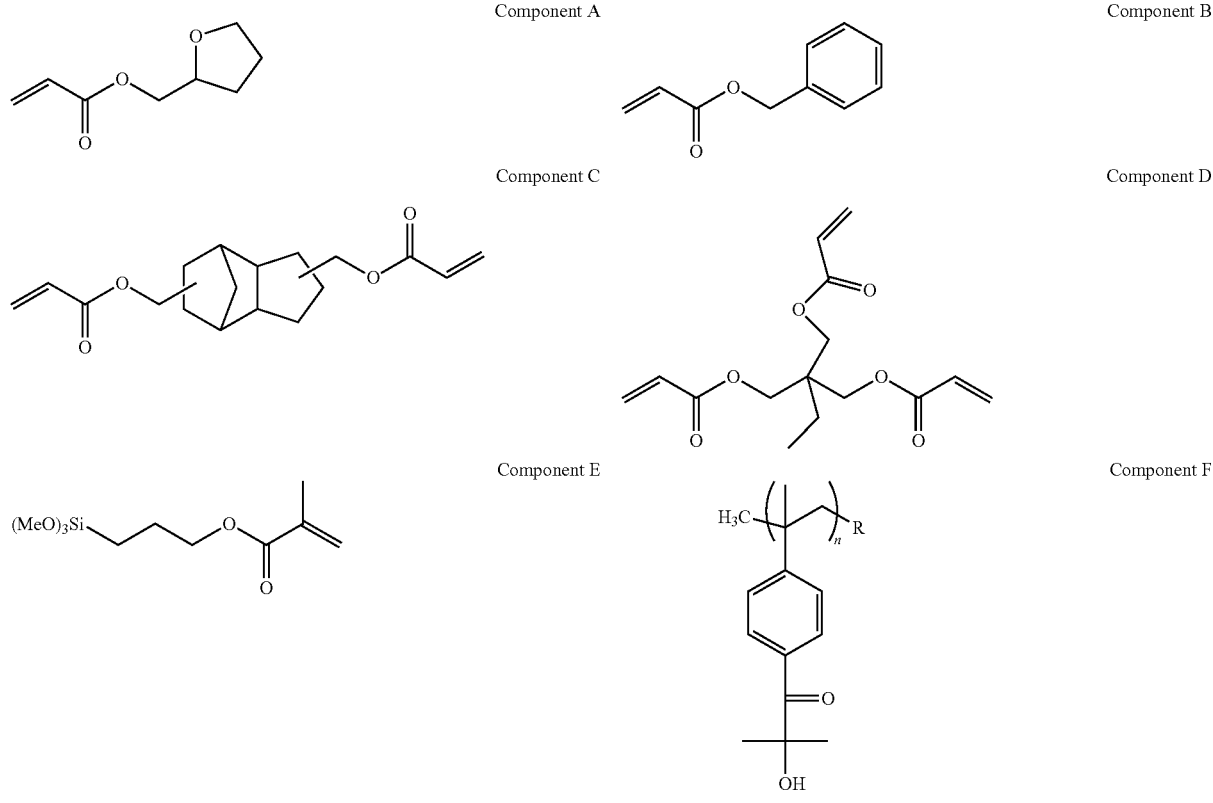

Esacure One
(the photo initiator made by Lamberti S.p.A.)

-continued
Component G
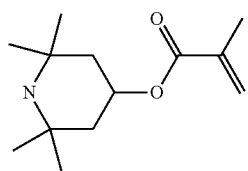
Component I
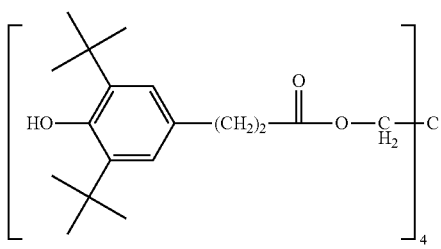
(MW 1178)
Component H
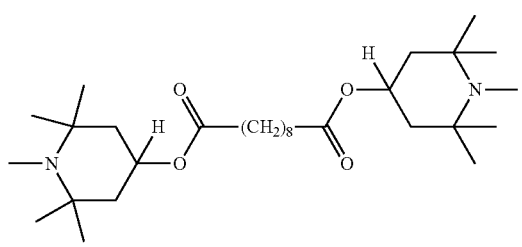
TINUVIN292
(the hindered amine stabilizer made by BASF)
Component J
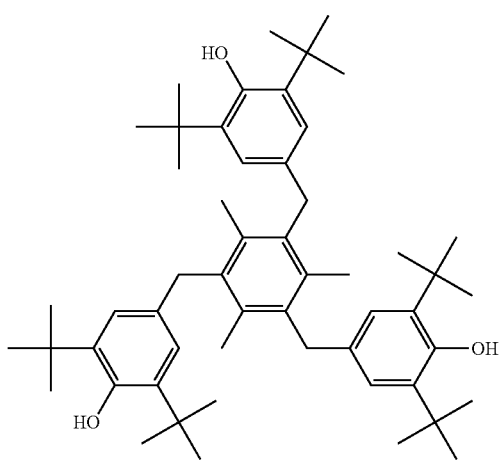
(Mw 775)
Component K
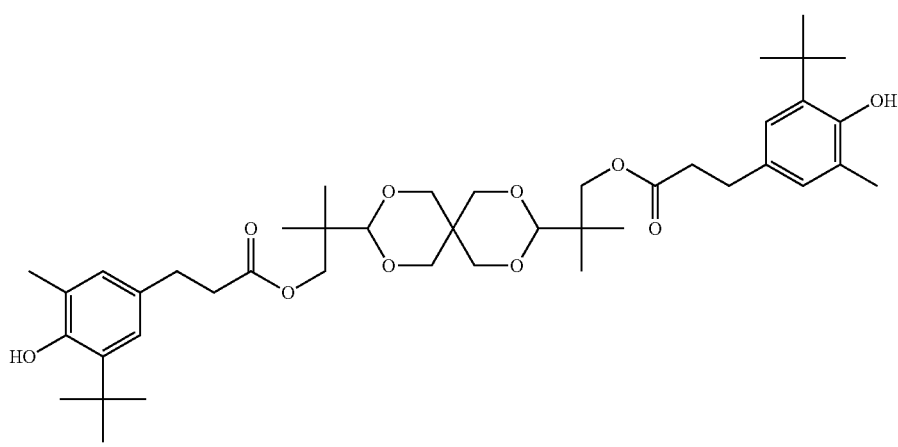
(Mw 741)

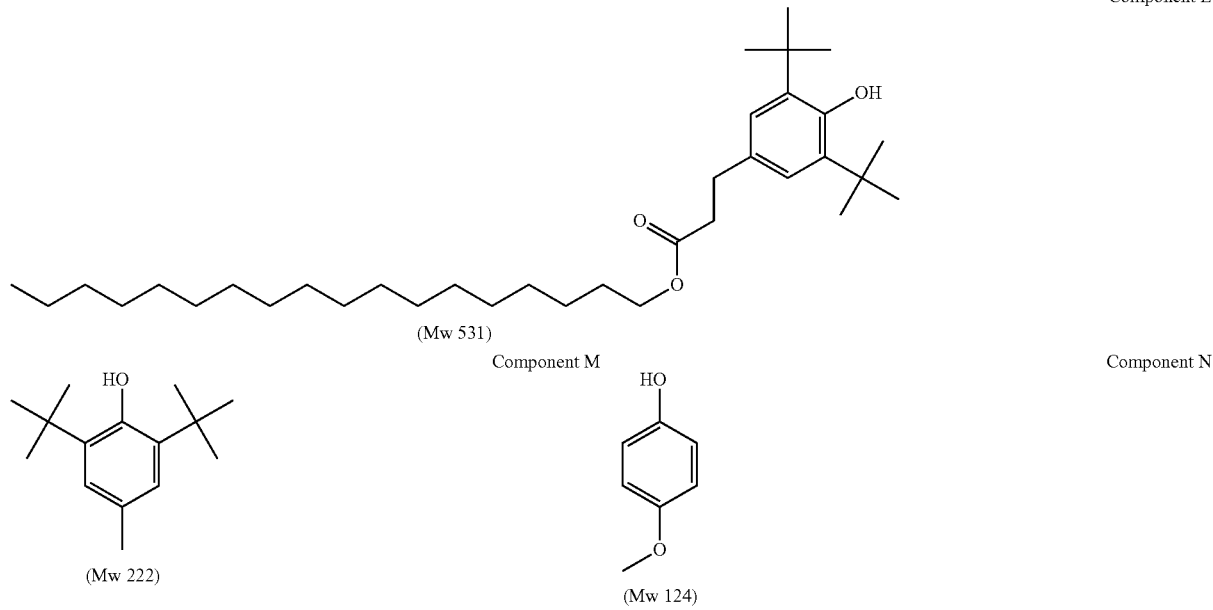

<Evaluation of Composition Sample>

Each of the obtained composition samples is subjected to a heat resistance test and a light resistance test as follows.
(Heat Resistance Test: Pattern with Height of 3 μm)

A heat resistance test is performed by placing an appropriate amount of a composition on a 2 cm² alkali-free glass (thickness 360 μm), placing a quartz mold (product name: NIM-PH3000, manufactured by NTT Advanced Technology Co., Ltd.) thereon, filling the composition into a pattern of the quartz mold, and exposing the composition to light in a nitrogen atmosphere with a Hg—Xe lamp at 20 mW/cm² (wavelength 365 nm) for 50 seconds.

Thereafter, the obtained cured product is released from the quartz mold, and a pattern height of the cured product is measured with a confocal laser microscope (product name: OLS 3100, manufactured by Olympus Corporation). The pattern height measurement is performed at a position of a line and a space where a height of a convex part is 3 μm and a line width is 5 μm.

The obtained cured product is put in a desktop reflow oven (product name: STR-3000RC, manufactured by Shin Apex Co., Ltd.), the cured product is heated from room temperature to 260° C. over five minutes in an air atmosphere, the temperature of the cured product is held at 260° C. for five minutes, and then the cured product is cooled to room temperature over 30 minutes. A pattern height of the resin molded product after heating is measured in a similar manner to that before heating, and the reduction ratio is determined from the pattern heights of the resin molded product before and after heating. Tables 1 to 3 indicate results thereof.
(Heat Resistance Test: Pattern with Height of 200 nm)

A heat resistance test is performed by placing an appropriate amount of a composition on a 3 cm² alkali-free glass (thickness 700 μm), placing a quartz mold (mold having a thickness of 6.35 mm, an area of 25 mm☐, and a pattern of a line and a space where a depth of a concave part is 200 nm and a line width of the concave part is 500 nm, manufactured by Toppan Printing Co., Ltd.) thereon, filling the composition into a pattern of the quartz mold, and exposing the composition to light in a nitrogen atmosphere with a Hg—Xe lamp at 20 mW/cm² (wavelength 365 nm) for 50 seconds.

Thereafter, the obtained cured product is released from the quartz mold, and a pattern height of the cured product is measured with an atomic force microscope (product name: NANOPICS 1000, manufactured by Seiko Instruments Inc.). The pattern height measurement is performed at a position of a line and a space where the height of a convex part is 200 nm and a line width is 500 nm.

The obtained cured product is put in the desktop reflow oven used in the above (heat resistance test: pattern with a height of 3 μm), the cured product is heated from room temperature to 260° C. over five minutes in an air atmosphere, the temperature of the cured product is held at 260° C. for five minutes, and then the cured product is cooled to room temperature over 30 minutes. A pattern height of the resin molded product after heating is measured in a similar manner to that before heating, and the reduction ratio is determined from the pattern heights of the resin molded product before and after heating. Tables 1 to 3 indicate results thereof.
(Light Resistance Test: Pattern with Height of 3 μm)

The cured product manufactured in the above (heat resistance test: pattern with a height of 3 μm) is put in a light resistance tester (product name: SUSTEST CPS+, manufactured by ATLAS), and is irradiated with light for 60 days under the following condition. The light resistance tester is set such that an optical filter is special window glass, black standard temperature is 60° C., and illuminance is 765 W/m² (300 to 800 nm) with a xenon lamp.

Pattern heights of the cured product before and after irradiation with light are measured with a confocal laser microscope (product name: OLS 3100, manufactured by Olympus Corporation). Table 4 indicates results thereof.
(Light Resistance Test: Pattern with Height of 200 nm)

The cured product manufactured in the above (heat resistance test: pattern with a height of 200 nm) is put in a light resistance tester (product name: SUSTEST CPS+, manufactured by ATLAS), and is irradiated with light for 60 days under the following condition. The light resistance tester is set such that an optical filter is special window glass, black standard temperature is 60° C., and illuminance is 765 W/m² (300 to 800 nm) with a xenon lamp.

Pattern heights of the cured product before and after irradiation with light are measured with an atomic force microscope (product name: NANOPICS 1000, manufactured by Seiko Instruments Inc.). Table 4 indicates results thereof.

(Appearance of Cured Film)

After the heat resistance test or the light resistance test, an appearance of the cured film was evaluated visually using the following index.

○: Coloring was hardly observed.
Δ: Coloring was slightly observed.
x: Coloring was observed.

(Heat Resistance Test: Transmittances Before and after Heating)

Transmittances before and after heating are determined by measuring transmittances at a wavelength of 450 nm of the cured product with a convexo-concave pattern before and after heated at 260° C. for five minutes.

A heat resistance test is performed by placing about 0.05 g of a composition on a Ni mold (product name: AR mold 2 (special product) 2200055088 made of Ni, manufactured by Kyodo International, Inc., having a thickness of 0.3 mm, an area of 3 cm×3 cm, a conical shaped concave part, and a pattern having a pattern pitch of 250 nm and a depth of 250 nm), placing 5 cm×5 cm alkali-free glass (thickness 700 μm) thereon, filling the composition into the pattern of the Ni mold, and exposing the composition to light in a nitrogen atmosphere with a Hg—Xe lamp at 10 mW/cm² (wavelength 365 nm) for 100 seconds.

Thereafter, an obtained cured product is released from the Ni mold to obtain a cured product having a convexo-concave pattern on the alkali-free glass. A transmittance of the obtained alkali-free glass and cured product at a wavelength of 450 nm is measured with a spectrophotometer (ultraviolet visible spectrophotometer, product name: V-550, manufactured by JASCO Corporation) to obtain a transmittance before heating. At this time, light from the spectrophotometer is made incident from a side of the cured product having a convexo-concave pattern. Thereafter, the obtained alkali-free glass and cured product are placed on a hot plate (hot plate, product name: HT-900, manufactured by AS ONE Corporation) set at 260° C. for five minutes. After five minutes, the obtained alkali-free glass and cured product are removed from the hot plate, and cooled to room temperature over 10 minutes. After the cooling to room temperature, a transmittance of the alkali-free glass and cured product after heating is measured with a spectrophotometer at a wavelength of 450 nm to obtain a transmittance after heating. Tables 1 to 3 indicate measurement results of the transmittances at a wavelength of 450 nm before and after heating.

(Light Resistance Test: Transmittances Before and after Light Resistance Test)

Transmittances before and after a light resistance test are determined by measuring the transmittances at a wavelength of 450 nm of a cured product with a convexo-concave pattern before and after irradiated with light.

The cured product manufactured in the above (heat resistance test: transmittances before and after heating) is subjected to a light resistance test as described below, and transmittances before and after irradiation with light are measured. A transmittance of the obtained alkali-free glass and cured product at a wavelength of 450 nm is measured with a spectrophotometer (ultraviolet visible spectrophotometer, product name: V-550, manufactured by JASCO Corporation) to obtain a transmittance before irradiation with light. At this time, light from the spectrophotometer is made incident from a side of the cured product having a convexo-concave pattern. Thereafter, the obtained alkali-free glass and cured product are put in a light resistance tester (product name: SUSTEST CPS+, manufactured by ATLAS), and are irradiated with light for 60 days under the following condition. The light resistance tester is set such that an optical filter is special window glass, black standard temperature is 60° C., and illuminance is 765 W/m² (300 to 800 nm) with a xenon lamp. A transmittance of the alkali-free glass and cured product after irradiation with light at a wavelength of 450 nm is measured with a spectrophotometer to obtain a transmittance after irradiation with light. Table 4 indicates measurement results of the transmittances at a wavelength of 450 nm before and after the light resistance test.

TABLE 1

|  |  | Sample 1 | Sample 2 | Sample 3 | Sample 4 | Sample 5 | Sample 6 |
|---|---|---|---|---|---|---|---|
| (Meth)acryloyl monomer | Component A | 60.0% | 59.9% | 59.4% | 57.1% | 59.4% | 57.1% |
|  | Component B | — | — | — | — | — | — |
|  | Component C | 21.0% | 21.0% | 20.8% | 20.0% | 20.8% | 20.0% |
|  | Component D | 15.0% | 15.0% | 14.9% | 14.3% | 14.9% | 14.3% |
|  | Component E | — | — | — | — | — | — |
| Polymerization initiator | Component F | 4.0% | 4.0% | 4.0% | 3.8% | 4.0% | 3.8% |
| Hindered amine compound | Component G | — | 0.1% | 1.0% | 4.8% | — | — |
|  | Component H | — | — | — | — | 1.0% | 4.8% |
| Hindered phenol compound | Component I | — | — | — | — | — | — |
|  | Component J | — | — | — | — | — | — |
|  | Component K | — | — | — | — | — | — |
|  | Component L | — | — | — | — | — | — |
|  | Component M | — | — | — | — | — | — |
|  | Component N | — | — | — | — | — | — |
| Reduction ratio of pattern before and after heating over five minutes at 260° C. | Pattern with height of 3 μm | 15.2% | 6.4% | 4.8% | 4.5% | 9.3% | 5.8% |
|  | Pattern with height of 200 nm | 14.4% | 6.3% | 6.3% | 3.7% | 10.1% | 5.5% |

TABLE 1-continued

| | | | | | | | |
|---|---|---|---|---|---|---|---|
| Appearance of cured film before and after heating over five minutes at 260° C. | | X | ○ | ○ | ○ | ○ | ○ |
| Transmittance of cured product having convexo-concave pattern at wavelength of 450 nm before and after heating over five minutes at 260° C. | Before heating | 94.9% | 94.9% | 94.9% | 94.9% | 94.9% | 94.9% |
| | After heating | 90.4% | 93.4% | 94.0% | 94.3% | 93.5% | 94.0% |

| | | Sample 7 | Sample 8 | Sample 9 | Sample 10 | Sample 11 |
|---|---|---|---|---|---|---|
| (Meth)acryloyl monomer | Component A | 59.9% | 59.7% | 59.4% | 57.1% | 58.8% |
| | Component B | — | — | — | — | — |
| | Component C | 21.0% | 20.9% | 20.8% | 20.0% | 20.6% |
| | Component D | 15.0% | 14.9% | 14.9% | 14.3% | 14.7% |
| | Component E | — | — | — | — | — |
| Polymerization initiator | Component F | 4.0% | 4.0% | 4.0% | 3.8% | 3.9% |
| Hindered amine compound | Component G | — | — | — | — | 1.0% |
| | Component H | — | — | — | — | — |
| Hindered phenol compound | Component I | 0.2% | 0.5% | 1.0% | 4.8% | 1.0% |
| | Component J | — | — | — | — | — |
| | Component K | — | — | — | — | — |
| | Component L | — | — | — | — | — |
| | Component M | — | — | — | — | — |
| | Component N | — | — | — | — | — |
| Reduction ratio of pattern before and after heating over five minutes at 260° C. | Pattern with height of 3 μm | 12.6% | 7.4% | 6.2% | 4.3% | 2.4% |
| | Pattern with height of 200 nm | 12.4% | 3.4% | 1.3% | 1.3% | 1.0% |
| Appearance of cured film after heating over five minutes at 260° C. | | Δ | ○ | ○ | ○ | ○ |
| Transmittance of cured product having convexo-concave pattern at wavelength of 450 nm before and after heating over five minutes | Before heating | 94.9% | 94.9% | 94.9% | 94.9% | 94.9% |
| | After heating | 92.9% | 94.8% | 94.5% | 94.5% | 94.9% |

TABLE 2

| | | Sample 12 | Sample 13 | Sample 14 | Sample 15 | Sample 16 | Sample 17 |
|---|---|---|---|---|---|---|---|
| (Meth)acryloyl monomer | Component A | — | — | — | — | — | — |
| | Component B | 60.0% | 59.9% | 59.7% | 59.4% | 57.1% | 59.9% |
| | Component C | 21.0% | 21.0% | 20.9% | 20.8% | 20.0% | 21.0% |
| | Component D | 15.0% | 15.0% | 14.9% | 14.9% | 14.3% | 15.0% |
| | Component E | — | — | — | — | — | — |
| Polymerization initiator | Component F | 4.0% | 4.0% | 4.0% | 4.0% | 3.8% | 4.0% |
| Hindered amine compound | Component G | — | 0.1% | 0.5% | 1.0% | 4.8% | — |
| | Component H | — | — | — | — | — | — |
| Hindered phenol compound | Component I | — | — | — | — | — | 0.1% |
| | Component J | — | — | — | — | — | — |
| | Component K | — | — | — | — | — | — |
| | Component L | — | — | — | — | — | — |
| | Component M | — | — | — | — | — | — |
| | Component N | — | — | — | — | — | — |
| Reduction ratio of pattern before and after heating over five minutes at 260° C. | Pattern with height of 3 μm | 13.5% | 8.5% | 4.4% | 5.0% | 5.1% | 9.4% |
| | Pattern with height of 200 nm | 13.5% | 8.0% | 6.4% | 5.0% | 4.2% | 8.8% |
| Appearance of cured film after heating over five minutes at 260° C. | | X | ○ | ○ | ○ | ○ | ○ |
| Transmittance of cured product having pattern of antireflective structure at wavelength of 450 nm before and after heating over five minutes at 260° C. | Before heating | 94.7% | 94.7% | 94.7% | 94.7% | 94.7% | 94.7% |
| | After heating | 92.1% | 93.8% | 94.5% | 94.6% | 94.5% | 93.7% |

| | | Sample 18 | Sample 19 | Sample 20 | Sample 21 | Sample 22 | Sample 23 |
|---|---|---|---|---|---|---|---|
| (Meth)acryloyl monomer | Component A | — | — | — | — | — | — |
| | Component B | 59.7% | 59.4% | 57.1% | 59.4% | 57.1% | 54.5% |
| | Component C | 20.9% | 20.8% | 20.0% | 20.8% | 20.0% | 19.1% |
| | Component D | 14.9% | 14.9% | 14.3% | 14.9% | 14.3% | 13.6% |
| | Component E | — | — | — | — | — | — |

TABLE 2-continued

| | | | | | | | |
|---|---|---|---|---|---|---|---|
| Polymerization initiator | Component F | 4.0% | 4.0% | 3.8% | 4.0% | 3.8% | 3.6% |
| Hindered amine compound | Component G | — | — | — | — | — | — |
| | Component H | — | — | — | 1.0% | 4.8% | 9.1% |
| Hindered phenol compound | Component I | 0.5% | 1.0% | 4.8% | — | — | — |
| | Component J | — | — | — | — | — | — |
| | Component K | — | — | — | — | — | — |
| | Component L | — | — | — | — | — | — |
| | Component M | — | — | — | — | — | — |
| | Component N | — | — | — | — | — | — |
| Reduction ratio of pattern before and after heating over five minutes at 260° C. | Pattern with height of 3 μm | 3.5% | 4.3% | 2.9% | 8.1% | 4.8% | 8.2% |
| | Pattern with height of 200 nm | 4.1% | 2.8% | 2.1% | 5.3% | 2.4% | 4.7% |
| Appearance of cured film after heating over five minutes at 260° C. | | ○ | ○ | ○ | ○ | ○ | ○ |
| Transmittance of cured product having convexo-concave pattern at wavelength of 450 nm before and after heating over five minutes at 260° C. | Before heating | 94.7% | 94.7% | 94.7% | 94.7% | 94.7% | 94.6% |
| | After heating | 94.5% | 94.5% | 94.3% | 94.6% | 94.5% | 94.2% |

TABLE 3

| | | Sample 24 | Sample 25 | Sample 26 | Sample 27 | Sample 28 | Sample 29 | Sample 30 | Sample 31 |
|---|---|---|---|---|---|---|---|---|---|
| (Meth)acryloyl monomer | Component A | 50.0% | 49.5% | 49.5% | 49.5% | 49.5% | 49.5% | 49.5% | 58.8% |
| | Component B | — | — | — | — | — | — | — | — |
| | Component C | 21.0% | 20.8% | 20.8% | 20.8% | 20.8% | 20.8% | 20.8% | 20.6% |
| | Component D | 15.0% | 14.9% | 14.9% | 14.9% | 14.9% | 14.9% | 14.9% | 14.7% |
| | Component E | 10.0% | 9.9% | 9.9% | 9.9% | 9.9% | 9.9% | 9.9% | — |
| Polymerization initiator | Component F | 4.0% | 4.0% | 4.0% | 4.0% | 4.0% | 4.0% | 4.0% | 3.9% |
| Hindered amine compound | Component G | — | — | — | — | — | — | — | — |
| | Component H | — | — | — | — | — | — | — | 1.0% |
| Hindered phenol compound | Component I | — | 1.0% | — | — | — | — | — | 1.0% |
| | Component J | — | — | 1.0% | — | — | — | — | — |
| | Component K | — | — | — | 1.0% | — | — | — | — |
| | Component L | — | — | — | — | 1.0% | — | — | — |
| | Component M | — | — | — | — | — | 1.0% | — | — |
| | Component N | — | — | — | — | — | — | 1.0% | — |
| Reduction ratio of pattern before and after heating over five minutes at 260° C. | Pattern with height of 3 μm | 15.1% | 5.6% | 7.9% | 4.5% | 15.3% | 13.4% | 14.1% | 5.0% |
| | Pattern with height of 200 nm | 17.7% | 4.5% | 6.8% | 7.5% | 17.6% | 18.0% | 18.4% | 1.3% |
| Appearance of cured film after heating over five minutes at 260° C. | | X | ○ | ○ | ○ | X | X | X | ○ |
| Transmittance of cured product having convexo-concave pattern at wavelength of 450 nm before and after heating over five minutes at 260° C. | Before heating | 94.9% | 94.9% | 94.9% | 94.9% | 94.9% | 94.9% | 94.9% | 94.9% |
| | After heating | 92.0% | 94.8% | 94.9% | 94.9% | 92.4% | 92.2% | 92.2% | 94.5% |

TABLE 4

| | | Sample 32 | Sample 33 | Sample 34 | Sample 35 | Sample 36 | Sample 37 |
|---|---|---|---|---|---|---|---|
| (Meth)acryloyl monomer | Component A | — | — | — | — | — | — |
| | Component B | 60.0% | 59.9% | 59.7% | 59.4% | 57.1% | 58.8% |
| | Component C | 21.0% | 21.0% | 20.9% | 20.8% | 20.0% | 20.6% |
| | Component D | 15.0% | 15.0% | 14.9% | 14.9% | 14.3% | 14.7% |
| | Component E | — | — | — | — | — | — |
| Polymerization initiator | Component F | 4.0% | 4.0% | 4.0% | 4.0% | 3.8% | 3.9% |
| Hindered amine compound | Component G | — | 0.1% | 0.5% | 1.0% | 4.8% | 1.0% |
| | Component H | — | — | — | — | — | — |
| Hindered phenol compound | Component I | — | — | — | — | — | 1.0% |
| | Component J | — | — | — | — | — | — |
| | Component K | — | — | — | — | — | — |
| | Component L | — | — | — | — | — | — |
| | Component M | — | — | — | — | — | — |
| | Component N | — | — | — | — | — | — |

TABLE 4-continued

|  |  | Sample 32 | Sample 33 | Sample 34 | Sample 35 | Sample 36 | Sample 37 |
|---|---|---|---|---|---|---|---|
| Reduction ratio of pattern height after light resistance test for 60 days | Pattern with height of 200 nm | 30.0% | 22.4% | 7.7% | 5.6% | 4.3% | 2.9% |
|  | Pattern with height of 3 μm | 20.7% | 17.9% | 7.3% | 5.2% | 2.7% | 2.0% |
| Appearance of cured film after light resistance test for 60 days |  | X | X | ◯ | ◯ | ◯ | ◯ |
| Transmittance of cured product having convexo-concave pattern at wavelength of 450 nm before and after light resistance test | Before heating | 94.9% | 94.9% | 94.9% | 94.9% | 94.9% | 94.9% |
|  | After heating | 88.2% | 89.3% | 94.0% | 94.8% | 94.8% | 94.9% |

As indicated in Tables 1 to 3, Composition Samples 2 to 11, 13 to 23, 25 to 27, and 31 containing at least one of the hindered amine compound and the hindered phenol compound having a molecular weight of 700 or more as the oxidation inhibitor have excellent heat resistance and can suppress the pattern reduction ratio. In addition, Tables indicate that there is a preferable content in the presence or absence of the polymerizable group of the hindered amine compound and in the hindered phenol compound. It is indicated that Samples 11 and 31 using a combination of the hindered amine compound and the hindered phenol compound having a molecular weight of 700 or more have better heat resistance than a sample containing either one of the oxidation inhibitors and that the pattern reduction ratio of Samples 11 and 31 can be suppressed.

Meanwhile, it is indicated that Samples 1, 12, 24, and 28 to 30 containing neither the hindered amine compound nor the hindered phenol compound having a molecular weight of 700 or more as the oxidation inhibitor have a large pattern reduction ratio and have poor heat resistance.

As indicated in Table 4, it is found that Composition Samples 33 to 37 containing an appropriate amount of a hindered amine compound as the oxidation inhibitor have excellent light resistance and can suppress the pattern reduction ratio. Meanwhile, it is indicated that Sample 32 containing no hindered amine compound as the oxidation inhibitor has a large pattern reduction ratio and poor light resistance. In addition, it is indicated that Sample 33 having a small blending amount of hindered amine compound has insufficient light resistance. It is found that Sample 37 using a combination of the hindered amine compound and the hindered phenol compound having a molecular weight of 700 or more has better light resistance than a sample containing either one of the oxidation inhibitors and that the pattern reduction ratio of Sample 37 can be suppressed.

From the above, it is found that formation of a pattern with a composition containing the hindered amine compound and/or the specific hindered phenol compound improves heat resistance and light resistance of the obtained cured product.

Note that, in both the heat resistance test and the light resistance test, samples having a good result of the pattern reduction ratio at the sample pattern height of 3 μm also tend to have a good result of the pattern reduction ratio at the sample pattern height of 200 nm similarly.

INDUSTRIAL APPLICABILITY

One aspect of the present invention can provide a method for manufacturing a device having excellent heat resistance and/or light resistance.

The invention claimed is:

1. A method for manufacturing a device including a substrate and a second film disposed above the substrate, comprising:
    forming a first film above the substrate using a composition containing a polymerizable monomer and an oxidation inhibitor; and
    forming the second film by curing the first film in a state where at least one part of a mold having a convexo-concave pattern is in contact with the first film, or after at least one part of the mold is brought into contact with the first film,
    wherein the oxidation inhibitor is at least one of a hindered amine compound and a hindered phenol compound having a molecular weight of 700 or more,
    a repetition period of the pattern is 10 nm to 1 mm and a height of the pattern is 1 nm to 2 mm, and
    the composition satisfies a relationship of $(t_{o(T)} - t_{x(T)})/t_{o(T)} \times 100 \leq 13.0$,
    where $t_{o(T)}$ is a height of a convex part of a convexo-concave part of a cured film having the convexo-concave part obtained by forming a coating film using the composition and then by curing the coating film in a state where the coating film is in contact with a convexo-concave part in which a depth of a recess is 3 μm and a line width thereof is 5 μm, included in the mold, and
    $t_{x(T)}$ is a height of the convex part after the cured film is heated from 25° C. to 260° C. over five minutes, then a temperature of the cured film is held at 260° C. for five minutes, and the cured film is cooled to 25° C. over 30 minutes.

2. The method according to claim 1, wherein the composition contains 0.05 to 10% by mass of the oxidation inhibitor.

3. The method according to claim 1, wherein the oxidation inhibitor is a combination of the hindered amine compound and the hindered phenol compound.

4. The method according to claim 3, wherein the hindered amine compound and the hindered phenol compound are blended such that the amount of the hindered phenol compound is 1 to 100 parts by mass relative to 10 parts by mass of the hindered amine compound.

5. The method according to claim 1, wherein the hindered amine compound has a polymerizable group selected from the group consisting of a (meth)acryloyloxy group, a vinyl group, an allyl group and a styryl group.

6. The method according to claim 1, wherein the hindered phenol compound has a molecular weight of 1000 or more.

* * * * *